United States Patent
Liu et al.

(10) Patent No.: US 12,538,765 B2
(45) Date of Patent: Jan. 27, 2026

(54) METHOD OF MAKING SOI DEVICE FROM BULK SILICON SUBSTRATE AND SOI DEVICE

(71) Applicant: Hangzhou HFC Semiconductor Co., Zhejiang (CN)

(72) Inventors: Youming Liu, Singapore (SG); Hok Min Ho, Hong Kong (CN); Beichao Zhang, Shanghai (CN)

(73) Assignee: HANGZHOU HFC SEMICONDUCTOR CO., Hangzhou (CN)

( * ) Notice: Subject to any disclaimer, the term of this patent is extended or adjusted under 35 U.S.C. 154(b) by 429 days.

(21) Appl. No.: 18/362,561

(22) Filed: Jul. 31, 2023

(65) Prior Publication Data

US 2024/0420993 A1 Dec. 19, 2024

(30) Foreign Application Priority Data

Jun. 14, 2023 (CN) .......................... 202310709430.X

(51) Int. Cl.
*H01L 21/762* (2006.01)
*H10D 86/00* (2025.01)
*H10D 86/01* (2025.01)

(52) U.S. Cl.
CPC ....... *H01L 21/76283* (2013.01); *H10D 86/01* (2025.01); *H10D 86/201* (2025.01)

(58) Field of Classification Search
CPC ........... H01L 21/7624; H01L 21/76243; H01L 21/76264; H01L 21/76283; H10D 30/021; H10D 30/0314; H10D 30/60; H10D 30/6744; H10D 62/115; H10D 86/01; H10D 86/201; Y02P 70/50

See application file for complete search history.

(56) References Cited

U.S. PATENT DOCUMENTS

| | | | |
|---|---|---|---|
| 2014/0287569 A1* | 9/2014 | Mori | .................... H10D 86/201 438/478 |
| 2021/0010971 A1* | 1/2021 | Campanella-Pineda | ..................... H10D 86/201 |

FOREIGN PATENT DOCUMENTS

CN 110569686 B * 8/2022 ........... G06K 9/0004

* cited by examiner

*Primary Examiner* — Nelson Garces
(74) *Attorney, Agent, or Firm* — MUNCY, GEISSLER, OLDS & LOWE, P.C.

(57) ABSTRACT

A method of making a silicon-on-insulator (SOI) device from a bulk silicon substrate and an SOI device are disclosed. In the method, a stack of a heteroepitaxial layer and a silicon epitaxial layer are formed on a bulk silicon substrate, and a first photolithography process is performed on the stack to form a first trench exposing the bulk silicon substrate. The first trench is filled with a first isolation dielectric, and a second photolithography process is performed on the stack to form a second trench. The first isolation dielectric and the second trench isolate the stack. Subsequently, the heteroepitaxial layer is removed from the stack, forming at least one cavity. Moreover, the at least one cavity is filled with a buried oxide layer. The buried oxide layer and the silicon epitaxial layer overlying the buried oxide layer form SOI substrate structures. SOI devices are formed on the SOI substrate structures.

11 Claims, 5 Drawing Sheets

METHOD OF MAKING SOI DEVICE FROM BULK SILICON SUBSTRATE AND SOI DEVICE

CROSS-REFERENCE TO RELATED APPLICATION

This application claims the priority of Chinese patent application number 202310709430.X, filed on Jun. 14, 2023, the entire contents of which are incorporated herein by reference.

TECHNICAL FIELD

The present invention relates to the field of semiconductor technology and, in particular, to a method of making a silicon-on-insulator (SOI) device from a bulk silicon substrate and an SOI device.

BACKGROUND

A silicon-on-insulator (SOI) substrate includes a bottom substrate and, stacked on the bottom substrate, a buried oxide layer and a top silicon layer. Compared with devices made from bulk silicon, SOI devices made from SOI substrates have a variety of advantages including latch-up elimination, small parasitic capacitance, a reduced leakage current, a fast speed, mitigated short-channel effects and particular applicability to low-voltage and low-power circuits.

Conventional SOI substrate fabrication processes involve bonding two bulk silicon substrates together and thinning one of the bulk silicon substrates or forming a silicon oxide layer within one of the bulk silicon substrates by uniformly implants oxygen ions therein at a specified depth. These methods are associated with very high overall fabrication cost and inconvenient adjustment of substrate parameters, which place limitations on practical application of SOI devices.

SUMMARY OF THE INVENTION

The present invention provides a method of making an SOI device from a bulk silicon substrate, in which semiconductor processes are employed to form SOI substrate structures on a bulk silicon substrate and then SOI devices on the SOI substrate structures. In this way, fabrication cost can be reduced. The present invention also provides an SOI device.

In one aspect, the present invention provides a method of making an SOI device from a bulk silicon substrate, which comprises: forming a stack of a heteroepitaxial layer and a silicon epitaxial layer above a surface of a bulk silicon substrate; performing a first photolithography process on the stack to form a first trench exposing the bulk silicon substrate; filling the first trench with a first isolation dielectric; performing a second photolithography process on the stack to form a second trench exposing the bulk silicon substrate, wherein the first isolation dielectric and the second trench isolate the stack, and wherein some side surfaces of the stack are covered by the first isolation dielectric while some other side surfaces of the stack are exposed in the second trench, wherein the stack is surrounded by the side surfaces; removing the heteroepitaxial layer from the stack to form at least one cavity delimited by the bulk silicon substrate and the silicon epitaxial layer; filling the at least one cavity with a buried oxide layer and filling the second trench with a second isolation dielectric, wherein the buried oxide layer and the silicon epitaxial layer overlying the buried oxide layer form at least one SOI substrate structure; and forming an SOI device on the SOI substrate structure.

In another aspect, the present invention provides an SOI device, which is made using the method as defined above. The semiconductor structure comprises a bulk silicon substrate, an SOI substrate structure formed on the bulk silicon substrate, a first isolation dielectric and a second isolation dielectric. The SOI substrate structure comprises a buried oxide layer stacked on the bulk silicon substrate and a silicon epitaxial layer stacked on the buried oxide layer. The first isolation dielectric covers some side surfaces of the SOI substrate structure, and the second isolation dielectric covers some other side surfaces of the SOI substrate structure, wherein the stack is surrounded by the side surfaces.

In the method of the present invention, the first isolation dielectric and the second trench isolate the stack of the heteroepitaxial layer and the silicon epitaxial layer so that some side surfaces of the stack are covered by the first isolation dielectric in the first trench while some other side surfaces of the stack are exposed in the second trench. As a result of the heteroepitaxial layer being removed from the stack, the cavities are formed between the bulk silicon substrate and the silicon epitaxial layer, followed by filling of the cavities with the buried oxide layer. The buried oxide layer and the silicon epitaxial layer overlying the buried oxide layer constitute the SOI substrate structures, and SOI devices may be formed on the SOI substrate structures. This method dispenses with making an SOI device from a dedicated SOI substrate, reducing fabrication cost of the SOI device. In addition, structural parameters of the SOI substrate structures can be flexibly adjusted as needed, helping in improving performance of the resulting SOI devices.

The SOI device of the present invention is made using the above-discussed method and includes the SOI substrate structure formed on the bulk silicon substrate. The SOI substrate structure can be fabricated at low cost and its structural parameters can be flexibly adjusted as needed, helping in improving performance of the SOI device.

DETAILED DESCRIPTION

Methods of making an SOI device from a bulk silicon substrate and SOI devices according to specific embodiments of the present invention will be described in greater detail below with reference to the accompanying drawings. It is to be understood that the figures are provided in a very simplified form not necessarily drawn to exact scale for the only purpose of facilitating easy and clear description of the embodiments. Additionally, as used herein, spatially relative terms are intended to encompass different orientations of the device in use or operation in addition to the orientation depicted in the figures. For example, if the device in the figures is inverted or otherwise oriented (e.g., rotated), the exemplary term "over" can encompass an orientation of "under" and other orientations.

Embodiments of the present invention relate to methods of making a SOI device from a bulk silicon substrate and semiconductor structures. The methods will be explained below with reference to FIGS. 1 to 8.

Figure 1:
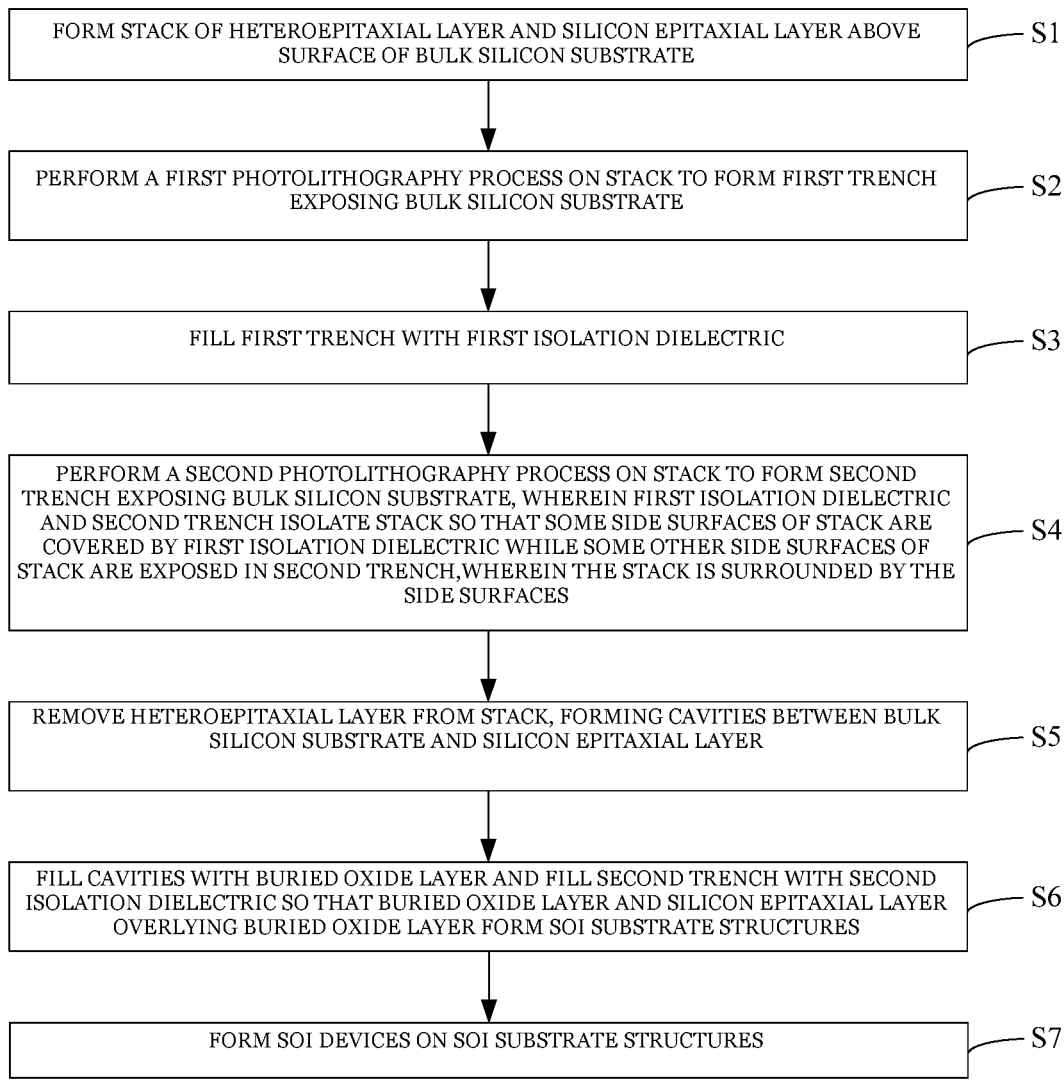
FIG. 1 is a flow diagram of a method of making an SOI device from a bulk silicon substrate according to an embodiment of the present invention.
Figure 2:
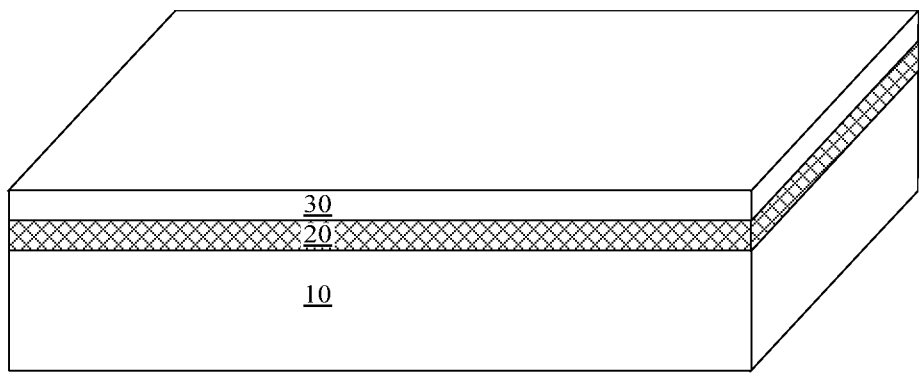
FIG. 2 is a schematic partial view of a structure resulting from forming a stack of a heteroepitaxial layer and a silicon epitaxial layer on a bulk silicon substrate in a method of making an SOI device from a bulk silicon substrate according to an embodiment of the present invention.

FIG. 1 is a flow diagram of a method of making an SOI device from a bulk silicon substrate according to an embodiment of the present invention. FIG. 2 shows a structure resulting from forming a stack of a heteroepitaxial layer 20 and a silicon epitaxial layer 30 on a bulk silicon substrate 10. Referring to FIGS. 1 and 2, according to an embodiment, in step S1, forming a stack of a heteroepitaxial layer 20 and a silicon epitaxial layer 30 on a surface of a bulk silicon substrate 10.

The bulk silicon substrate 10 is, for example, a silicon wafer. The heteroepitaxial layer 20 may be formed on a top surface of the bulk silicon substrate 10 by performing an epitaxial process. The silicon epitaxial layer 30 may be formed on a top surface of the heteroepitaxial layer 20 by performing an epitaxial process. Thicknesses of the heteroepitaxial layer 20 and the silicon epitaxial layer 30 may be flexibly adjusted depending on the requirements of practical applications. As an example, the thickness of the heteroepitaxial layer 20 may be approximately 0.1 μm to 5 μm (i.e., greater than or equal to 0.1 μm and smaller than or equal to 5 μm), and the thickness of the silicon epitaxial layer 30 may be approximately 50 nm to 1 μm.

In this embodiment, the heteroepitaxial layer 20 is formed as a sacrificial layer to be removed subsequently. Accordingly, it is chosen as a material having high etch selectivity with respect to both the bulk silicon substrate 10 and the silicon epitaxial layer 30 and facilitating growth of the silicon epitaxial layer 30. As an example, the heteroepitaxial layer 20 may include at least one of silicon germanium (SiGe), silicon carbide (SiC), gallium nitride (GaN), gallium arsenide (GaAs), gallium phosphide (GaP), aluminum gallium (AlGa), indium phosphide (InP), indium arsenide (InAs) and indium antimonide (InSb). Alternatively, the heteroepitaxial layer 20 may further include at least one of gallium arsenide phosphide (GaAsP), aluminum indium arsenide (AlInAs), aluminium gallium arsenide (AlGaAs), indium gallium arsenide (GaInAs), indium gallium phosphide (GaInP) and gallium indium arsenide phosphide (GaInAsP). In the following embodiments, the heteroepitaxial layer 20 is a SiGe epitaxial layer, for example. If necessary, the silicon epitaxial layer 30 may be p-doped (e.g., with boron or gallium) or n-doped (e.g., with phosphorus or arsenic). It is noted that the bulk silicon substrate 10, the heteroepitaxial layer 20 and the silicon epitaxial layer 30 are only shown in part in FIG. 2.

Figure 3:
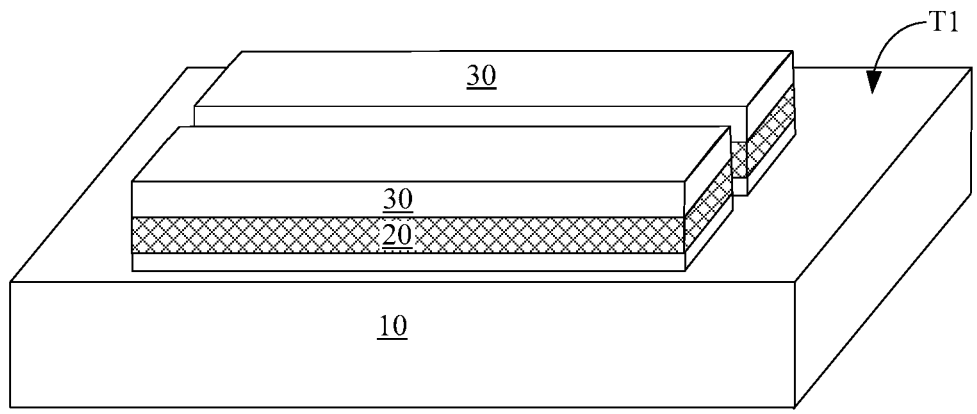
FIG. 3 is a schematic partial view of a structure resulting from forming a first trench in a method of making an SOI device from a bulk silicon substrate according to an embodiment of the present invention.

FIG. 3 shows a structure resulting from forming a first trench T1 in the method according to an embodiment of the present invention. Referring to FIGS. 1 and 3, in step S2, photolithography and etching processes are performed on the stack of the silicon epitaxial layer 30 and the heteroepitaxial layer 20 to form a first trench T1 exposing the bulk silicon substrate 10 thereof. The etching process may be such an over-etch process that the bulk silicon substrate 10 may be partially etched away and the first trench T1 extends through the top surface of the silicon epitaxial layer 30 into the bulk silicon substrate 10.

Specifically, in step S2, the photolithography process may be first performed using a photomask to create a patterned mask (e.g., photoresist) on the silicon epitaxial layer 30. The subsequent etching process may be a dry etching process, which is carried out with the mask protecting regions not to be etched. The etching process may successively proceed through the silicon epitaxial layer 30 and the heteroepitaxial layer 20, resulting in the formation of the first trench T1. As shown in FIG. 3, in this embodiment, the first trench T1 isolates the stack of the heteroepitaxial layer 20 and the silicon epitaxial layer 30. As a result of the formation of the first trench T1, at least one first sub-stack is formed on the bulk silicon substrate 10, each of which includes a portion of the heteroepitaxial layer 20 stacked with a portion of the silicon epitaxial layer 30.

Figure 4A:
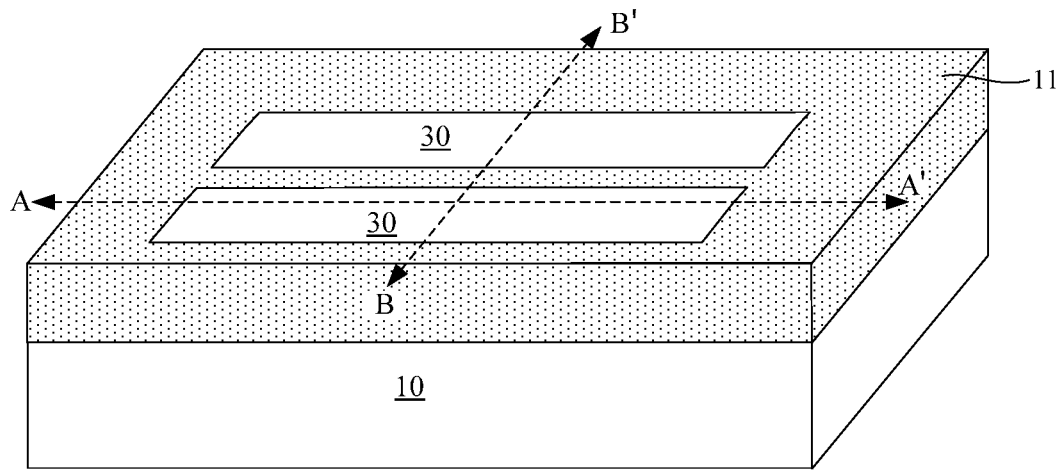
FIG. 4A is a schematic partial view of a structure resulting from filling a first trench with a first isolation dielectric in a method of making an SOI device from a bulk silicon substrate according to an embodiment of the present invention.
Figure 4B:
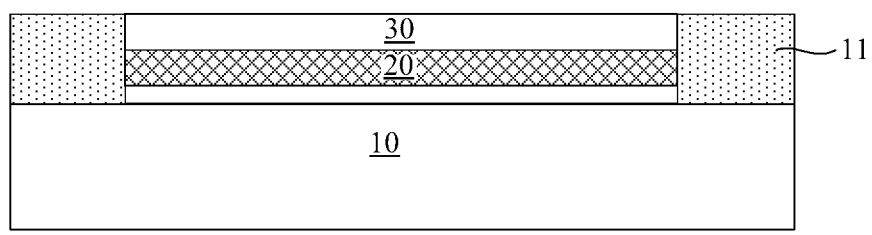
FIGS. 4B and 4C are schematic cross-sectional views taken along lines AA' and BB' in FIG. 4A, respectively.
Figure 4C:
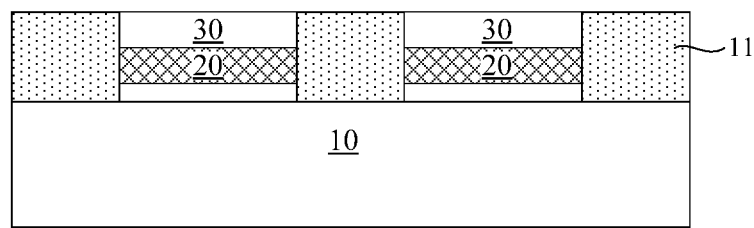

FIG. 4A shows a structure resulting from filling the first trench T1 with a first isolation dielectric 11. FIG. 4B shows a cross-section taken along line AA' in FIG. 4A. FIG. 4C shows a cross-section taken along line BB' in FIG. 4A. Referring to FIGS. 1 and 4A to 4C, in step S3, the first trench T1 is filled with the first isolation dielectric 11. In particular, this may include the steps of: depositing the first isolation dielectric material, which may include at least one of silicon nitride and silicon oxide, into the first trench 10a and onto the top surface of the silicon epitaxial layer 30 by performing a chemical vapor deposition (CVD) process; and then removing a portion of the first isolation dielectric material by performing a chemical mechanical polishing (CMP) process so that the silicon epitaxial layer 30 is exposed and the remaining first isolation dielectric material within the first trench T1 forms the first isolation dielectric 11.

Figure 5A:
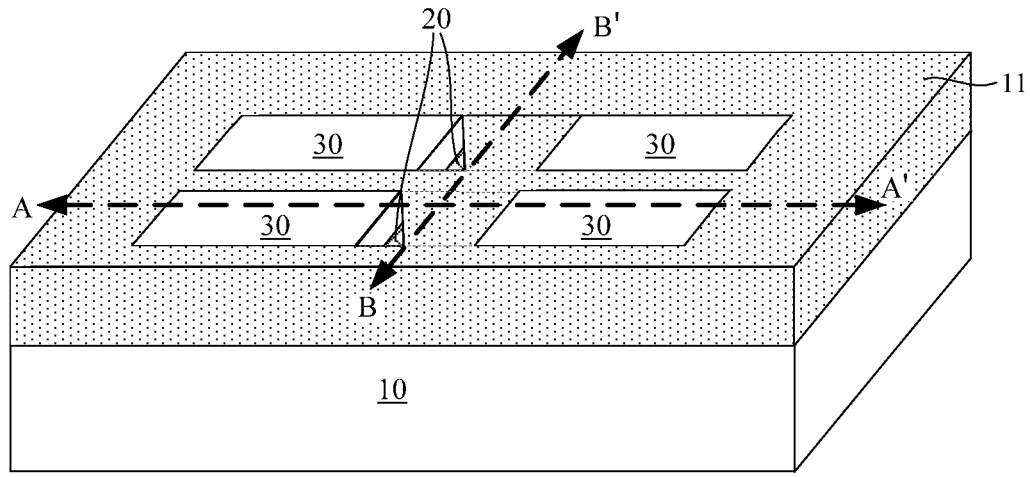
FIG. 5A is a schematic partial view of a structure resulting from forming a second trench in a method of making an SOI device from a bulk silicon substrate according to an embodiment of the present invention.
Figure 5B:
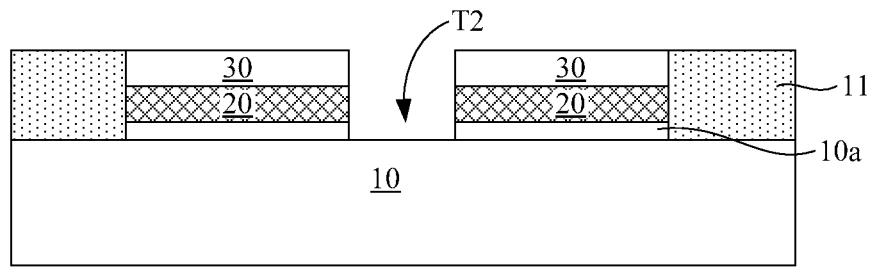
FIGS. 5B and 5C are schematic cross-sectional views taken along lines AA' and BB' in FIG. 5A, respectively.
Figure 5C:
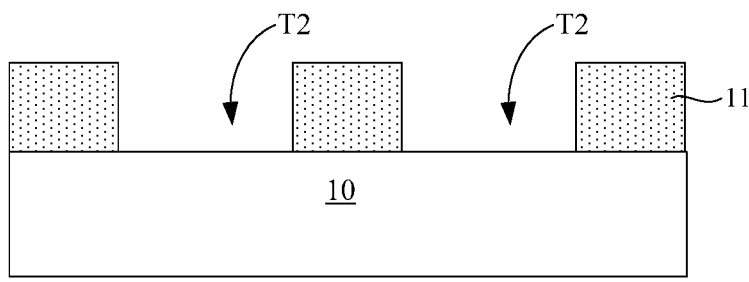

FIG. 5A shows a structure resulting from forming a second trench T2. FIG. 5B shows a cross-section taken along line AA' in FIG. 5A. FIG. 5C shows a cross-section taken along line BB' in FIG. 5A. Referring to FIGS. 1 and 5A to 5C, in step S4, other photolithography and etching processes are performed on the stack of the silicon epitaxial layer 30 and the heteroepitaxial layer 20 to form a second trench T2 exposing the bulk silicon substrate 10. The first isolation dielectric 11 and the second trench T2 isolate the stack of the heteroepitaxial layer 20 and the silicon epitaxial layer 30. As a result of the formation of the second trench T2, each first sub-stack on the bulk silicon substrate 10 is further divided into at least one second sub-stack each including a portion of the heteroepitaxial layer 20 stacked with a portion of the silicon epitaxial layer 30.

The etching process may be such an over-etch process that the bulk silicon substrate 10 may be partially etched away and the resulting second trench T2 extends through the top surface of the silicon epitaxial layer 30 into the bulk silicon substrate 10. For example, the first trench T1 and the second trench T2 may have the same depth. The first isolation dielectric 11 filled in the first trench T1 and the second trench T2 isolate the bulk silicon substrate 10, thereby forming bulk silicon mesas 10a located under the stack of the heteroepitaxial layer 20 and the silicon epitaxial layer 30.

As the first trench T1 being filled with the first isolation dielectric 11, some side surfaces of the stack of the heteroepitaxial layer 20 and the silicon epitaxial layer 30 are covered by the first isolation dielectric 11 in the first trench T1, while some other side surfaces thereof are exposed in the second trench T2, wherein the stack is surrounded by the side surfaces.

SOI substrate structures are formed by the isolated sub-stack of heteroepitaxial layer 20 and the silicon epitaxial layer 30. That is, the first trench T1 and the second trench T2 together delimit areas where the SOI substrate structures are formed. The first trench T1 and the second trench T2 cross each other so that all the SOI substrate structure are isolated from any other structure of the bulk silicon substrate 10. As an example, the second trench T2 extends transversely along line BB' in FIG. 5A to further isolate the stack that has already been isolated by the first trench T1. However, the present invention is not so limited, and in some other embodiments, the first trench T1 and the second trench T2 may be combined in another way to delimit the areas where the SOI substrate structures are formed. As an example, the stack isolated by the first isolation dielectric 11 and the second trench T2 (i.e., the SOI substrate structures to be formed) have square transverse cross-sections. In one implementation, the squares are coupled to the first trench T1 along one side and to the second trench T2 along the other three sides. In another implementation, the squares are coupled to the first trench T1 along two sides and to the second trench T2 along the other two sides. In yet another implementation, the squares are coupled to the first trench T1 along three sides and to the second trench T2 along the other side. It will be understood that the transverse cross-sections of the isolated stack (i.e., the SOI substrate structures to be formed) are not limited to being square, but may be other shapes.

In this embodiment, a single SOI substrate structure is formed at each portion of the stack of the heteroepitaxial layer 20 and the silicon epitaxial layer 30 isolated by the first isolation dielectric 11 and the second trench T2, and the locations and extents of the SOI substrate structures may be adjusted by modifying the photomask pattern for forming the first trench T1 and the second trench T2.

Figure 6A:
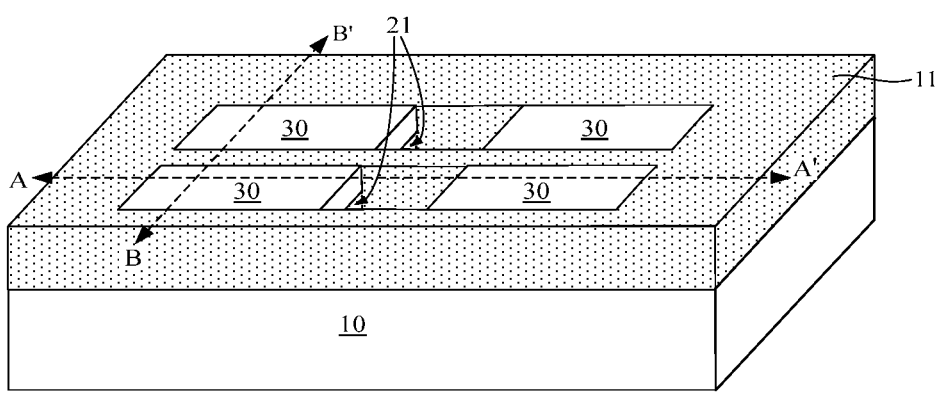
FIG. 6A is a schematic partial view of a structure resulting from removal of a heteroepitaxial layer from a stack of layers and hence formation of cavities in a method of making an SOI device from a bulk silicon substrate according to an embodiment of the present invention.
Figure 6B:
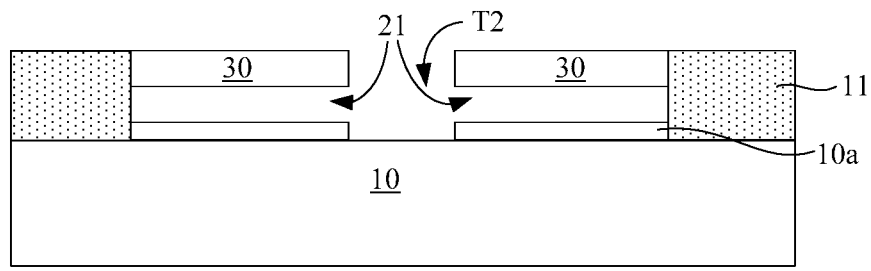
FIGS. 6B and 6C are schematic cross-sectional views taken along lines AA' and BB' in FIG. 6A, respectively.
Figure 6C:
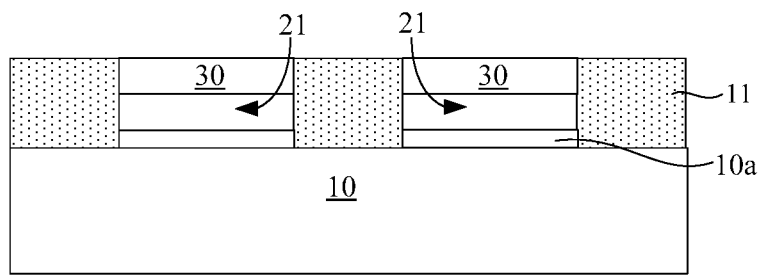

FIG. 6A shows a structure resulting from removing the heteroepitaxial layer 20 from the stack. FIG. 6B shows a cross-section taken along line AA' in FIG. 6A. FIG. 6C shows a cross-section taken along line BB' in FIG. 6A. Referring to FIGS. 1 and 6A to 6C, in step S5, the heteroepitaxial layer 20 is removed from the stack, forming cavities 21 between the bulk silicon substrate 10 (more precisely, the bulk silicon mesas 10a) and the silicon epitaxial layer 30. During the removal of the heteroepitaxial layer 20, the first isolation dielectric 11 in the first trench T1 can provide support for the silicon epitaxial layer 30.

The heteroepitaxial layer 20 may be completely removed from the stack by performing a suitable anisotropic etching process (e.g., a wet etching process). The etching process preferably has a higher etch rate on the heteroepitaxial layer 20 relative to silicon and the first isolation dielectric 11. As a result of removing the heteroepitaxial layer 20, the each cavity 21 is delimited by the bulk silicon mesa 10a, the silicon epitaxial layer 30 located above the respective bulk silicon mesa 10a and the first isolation dielectric 11 located laterally to the bulk silicon mesa 10a, and a top surface of the bulk silicon mesa 10a, a backside surface of the silicon epitaxial layer 30 (i.e., the surface of the silicon epitaxial layer 30 facing the bulk silicon substrate 10) and side surfaces of the first isolation dielectric 11 are exposed in each cavity 21.

Figure 7A:
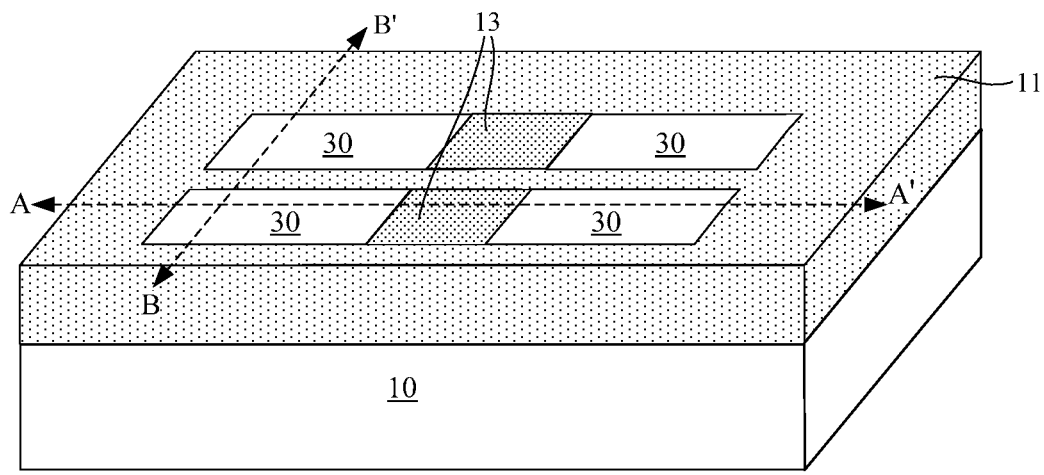
FIG. 7A is a schematic partial view of a structure resulting from filling cavities with a buried oxide layer in a method of making an SOI device from a bulk silicon substrate according to an embodiment of the present invention.
Figure 7B:
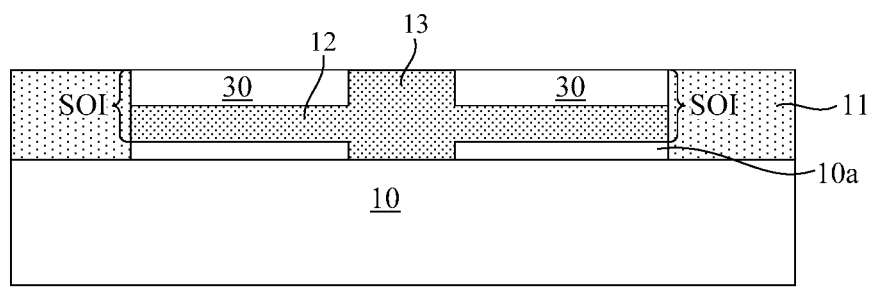
FIGS. 7B and 7C are schematic cross-sectional views taken along lines AA' and BB' in FIG. 7A, respectively.
Figure 7C:
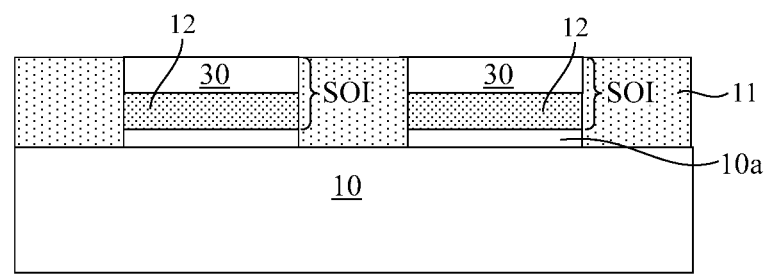

FIG. 7A shows a structure resulting from filling the cavities 21 with a buried oxide layer 12. FIG. 7B shows a cross-section taken along line AA' in FIG. 7A. FIG. 7C shows a cross-section taken along line BB' in FIG. 7A. Referring to FIGS. 1 and 7A to 7C, in step S6, filling the cavities 21 with a buried oxide layer 12. The buried oxide layer 12 and the silicon epitaxial layer 30 overlying the buried oxide layer 12 make up SOI substrate structures. The buried oxide layer 12 includes silicon oxide, for example. The buried oxide layer 12 may have, for example, the same thickness as the removed heteroepitaxial layer 20, which may be approximately 0.1 μm to 5 μm.

Since the cavities 21 communicate with the second trench T2, during the formation of the buried oxide layer 12 by filling an oxide material into the cavities 21, the oxide material may further fill the second trench T2 and be deposited on the first isolation dielectric 11 in the first trench T1. In particular, this may include the steps of: depositing the oxide material into the cavities 21 and the second trench T2 and onto top surfaces of the silicon epitaxial layer 30 and the first isolation dielectric 11 in the first trench T1 by performing an atomic layer deposition (ALD) process; removing a portion of the oxide material by performing a CMP process so that the top surface of the silicon epitaxial layer 30 is exposed and the remaining oxide material in the cavities 21 and the second trench T2 forms the buried oxide layer 12 located in the cavities 21 and a second isolation dielectric 13 located in the second trench T2. The first isolation dielectric 11 in the first trench T1 and the second isolation dielectric 13 in the second trench T2 may be connected to form shallow trench isolation (STI) structures.

Figure 8:
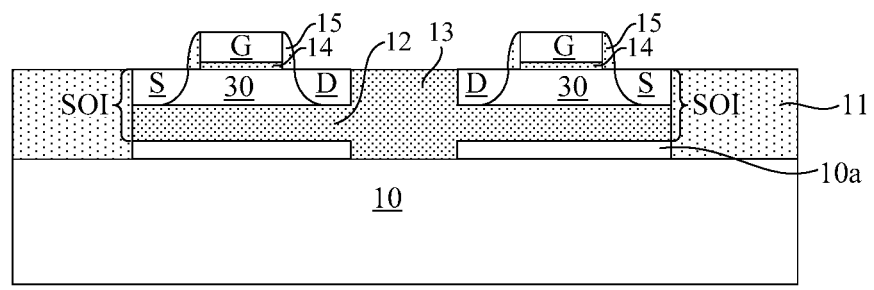
FIG. 8 is a schematic cross-sectional view of a structure resulting from forming SOI devices on the basis of SOI substrate structures in a method of making an SOI device from a bulk silicon substrate according to an embodiment of the present invention.

FIG. 8 shows a cross-sectional view of a structure resulting from forming SOI devices on the basis of the SOI substrate structures, which is taken, for example, along the same line along which the cross-section of FIG. 7B is taken. Referring to FIG. 8, in step S7, SOI devices may be formed on the basis of the aforementioned SOI substrate structures. As an example, MOS transistors may be formed on the SOI substrate structures. Each MOS transistor may include a gate dielectric layer 14 on the top surface of the silicon epitaxial layer 30, a gate G on the gate dielectric layer 14, spacers 15 covering sidewalls of the gate dielectric layer 14 and the gate G, and source S and drain D regions in the silicon epitaxial layer 30 at opposite sides.

In the method as described in the foregoing embodiments, the first isolation dielectric 11 and the second trench T2 isolate the stack of the heteroepitaxial layer 20 and the silicon epitaxial layer 30, and some side surfaces of the stack are covered by the first isolation dielectric 11 in the first trench T1 while some other side surfaces of the stack are exposed in the second trench T2. As a result of the heteroepitaxial layer 20 being removed from the stack, the cavities 21 are formed between the bulk silicon substrate 10 and the silicon epitaxial layer 30, followed by filling of the cavities 21 with the buried oxide layer 12. The buried oxide layer 12 and the silicon epitaxial layer 30 overlying the buried oxide layer 12 constitute the SOI substrate structures, and SOI devices may be formed on the SOI substrate structures. This method dispenses with making an SOI device from a dedicated SOI substrate, reducing fabrication cost of the SOI device. In addition, structural parameters of the SOI substrate structures can be flexibly adjusted as needed, helping in improving performance of the resulting SOI devices.

Embodiments of the present invention are also directed to an SOI device, which is made using the above-described method. Referring to FIGS. 1 to 8, the SOI device includes a bulk silicon substrate 10, an SOI substrate structure formed on the bulk silicon substrate 10, and first and second isolation dielectrics 11, 13 surrounding the SOI substrate structure. The SOI substrate structure includes a buried oxide layer 12 stacked on the bulk silicon substrate 10 and a silicon epitaxial layer 30 stacked on the buried oxide layer 12. The first isolation dielectric 11 covers some side surfaces of the SOI substrate structure, and the second isolation dielectric 13 covers the other side surfaces of the SOI substrate structure. As an example, the SOI device may include at least one MOS transistor formed on the basis of the SOI substrate structure.

In this embodiment, the first isolation dielectric 11 is filled in a first trench T1, and the second isolation dielectric 13 is filled in a second trench T2. The first isolation dielectric 11 and the second isolation dielectric 13 may include at least one of silicon nitride and silicon oxide. The first trench T1 and the second trench T2 together delimit the extent of the SOI substrate structure. The buried oxide layer 12 in the SOI substrate structure and the second isolation dielectric 13 in the second trench T2 may be formed in a single deposition process and may, for example, both include silicon oxide. The buried oxide layer 12 has a thickness of about 0.1 μm to 5 μm.

In some embodiments, the bulk silicon substrate 10 includes a bulk silicon mesa 10a, wherein the SOI substrate structure is formed on a top surface of the bulk silicon mesa 10a. The buried oxide layer 12 in the SOI substrate structure and the second trench T2 may include silicon oxide. The first isolation dielectric 11 in the first trench T1 and the buried oxide layer 12 in the second trench T2 may be connected to form a shallow trench isolation (STI) structure.

The SOI device in the embodiments described herein is made using the above-discussed method and includes the SOI substrate structure formed on the bulk silicon substrate 10. The SOI substrate structure can be fabricated at low cost and its structural parameters can be flexibly adjusted as needed, helping in improving performance of the SOI device.

It is noted that the embodiments disclosed herein are described in a progressive manner, with the description of each embodiment focusing on its differences from others. Reference can be made between the embodiments for their identical or similar features.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method of making a silicon-on-insulator (SOI) device from a bulk silicon substrate, comprising:
    forming a stack of a heteroepitaxial layer and a silicon epitaxial layer above a surface of a bulk silicon substrate;
    performing a first photolithography process on the stack to form a first trench exposing the bulk silicon substrate;
    filling the first trench with a first isolation dielectric;
    performing a second photolithography process on the stack to form a second trench exposing the bulk silicon substrate, wherein the first isolation dielectric and the second trench isolate the stack, and wherein some side surfaces of the stack are covered by the first isolation dielectric while some other side surfaces of the stack are exposed in the second trench, wherein the stack is surrounded by the side surfaces;
    removing the heteroepitaxial layer from the stack to form at least one cavity delimited by the bulk silicon substrate and the silicon epitaxial layer;
    filling the at least one cavity with a buried oxide layer and filling the second trench with a second isolation dielectric, wherein the buried oxide layer and the silicon epitaxial layer overlying the buried oxide layer form at least one SOI substrate structure; and
    forming an SOI device on the SOI substrate structure.

2. The method of claim 1, wherein forming the buried oxide layer and the second isolation dielectric comprises:
    depositing an oxide material into the at least one cavity and the second trench, and onto a top surface of the silicon epitaxial layer and a top surface of the first isolation dielectric; and
    performing a chemical mechanical polishing (CMP) process to remove a portion of the oxide material so that remaining oxide material located in the at least one cavity and the second trench forms the buried oxide layer and the second isolation dielectric, respectively.

3. The method of claim 1, wherein the first isolation dielectric and the second isolation dielectric are connected to form shallow trench isolation structures.

4. The method of claim 1, wherein after forming the second trench, the first isolation dielectric and the second trench isolate the bulk silicon substrate so as to form at least one bulk silicon mesa located under the stack.

5. The method of claim 4, wherein after removing the heteroepitaxial layer from the stack, a top surface of the at least one bulk silicon mesa, a backside surface of the silicon epitaxial layer and side surfaces of the first isolation dielectric are exposed in the at least one cavity, wherein the cavity is delimited by the bulk silicon mesa and the silicon epitaxial layer.

6. The method of claim 1, wherein filling the first trench with the first isolation dielectric comprises:
    depositing an isolation dielectric material into the first trench and onto a top surface of the silicon epitaxial layer by a chemical vapor deposition process; and removing a portion of the isolation dielectric material by a CMP process, wherein remaining isolation dielectric material is received in the first trench and forms the first isolation dielectric.

7. The method of claim 1, wherein the heteroepitaxial layer comprises at least one of silicon germanium, silicon carbide, gallium nitride, gallium arsenide, gallium phosphide, aluminum gallium, indium phosphide, indium arsenide and indium antimonide.

8. A silicon-on-insulator (SOI) device made using the method of claim 1, the SOI device comprising:
 a bulk silicon substrate;
 an SOI substrate structure formed on the bulk silicon substrate, wherein the SOI substrate structure comprises a buried oxide layer stacked on the bulk silicon substrate and a silicon epitaxial layer stacked on the buried oxide layer;
 a first isolation dielectric, covering some side surfaces of the SOI substrate structure; and
 a second isolation dielectric, covering some other side surfaces of the SOI substrate structure;
 wherein the stack is surrounded by the side surfaces.

9. The SOI device of claim 8, wherein the bulk silicon substrate comprises a bulk silicon mesa, and wherein the SOI substrate structure is formed on a top surface of the bulk silicon mesa.

10. The SOI device of claim 8, wherein the buried oxide layer has a thickness of 0.1 μm to 5 μm.

11. The SOI device of claim 8, wherein the first isolation dielectric and the second isolation dielectric are connected to form shallow trench isolation structures.

* * * * *